(12) United States Patent
Wen et al.

(10) Patent No.: US 10,555,269 B2
(45) Date of Patent: Feb. 4, 2020

(54) AMPLIFIER CIRCUIT HAVING CONTROLLABLE OUTPUT STAGE

(71) Applicant: MEDIATEK INC., Hsin-Chu (TW)

(72) Inventors: Sung-Han Wen, Hsinchu (TW); Ya-Chi Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/121,644

(22) Filed: Sep. 5, 2018

(65) Prior Publication Data

US 2019/0166566 A1 May 30, 2019

Related U.S. Application Data

(60) Provisional application No. 62/590,413, filed on Nov. 24, 2017.

(51) Int. Cl.
| | | |
|---|---|---|
| *H04W 52/52* | (2009.01) | |
| *H03F 1/02* | (2006.01) | |
| *H03F 3/217* | (2006.01) | |
| *H03F 1/32* | (2006.01) | |

(52) U.S. Cl.
CPC ............ *H04W 52/52* (2013.01); *H03F 1/025* (2013.01); *H03F 1/0227* (2013.01); *H03F 1/3241* (2013.01); *H03F 3/217* (2013.01)

(58) Field of Classification Search
CPC ....... H03M 1/70; H04W 52/52; H03F 1/0227; H03F 1/025; H03F 3/3241; H03F 3/217
See application file for complete search history.

(56) References Cited

U.S. PATENT DOCUMENTS

| | | | |
|---|---|---|---|
| 4,070,632 A | | 1/1978 | Tuttle |
| 4,458,213 A | * | 7/1984 | Quan ...................... H03F 1/303 |
| | | | 330/265 |
| 4,638,260 A | | 1/1987 | Hamley |
| 5,055,797 A | | 10/1991 | Chater |
| 5,311,145 A | | 5/1994 | Huijsing |
| 5,406,425 A | | 4/1995 | Johnston |

(Continued)

FOREIGN PATENT DOCUMENTS

| | | |
|---|---|---|
| CN | 100483930 C | 4/2009 |
| CN | 106656085 | 5/2017 |
| JP | S58-187007 A | 11/1983 |

OTHER PUBLICATIONS

Sherif Galal, "A 60 mW Class-G Stereo Headphone Driver for Portable Battery-Powered Devices", IEEE Journal of Solid-State Circuits, vol. 47, No. 8, Aug. 2012.

(Continued)

*Primary Examiner* — Thanh C Le
(74) *Attorney, Agent, or Firm* — Winston Hsu

(57) ABSTRACT

The present invention provides an amplifier circuit, wherein the amplifier circuit includes a DAC, an output stage and a detector. In the operations of the amplifier circuit, the DAC is arranged for performing a digital-to-analog converting operation upon a digital input signal to generate an analog signal, the output stage is arranged for receiving the analog signal to generate an output signal, and the detector is arranged for detecting a characteristic of the input signal, and referring to the characteristic of the input signal to generate at least one control signal to adjust the output stage at a zero-crossing point of the output signal.

20 Claims, 4 Drawing Sheets

(56) References Cited

U.S. PATENT DOCUMENTS

| | | |
|---|---|---|
| 5,408,235 A | 4/1995 | Doyle et al. |
| 5,838,269 A | 11/1998 | Xie |
| 5,841,385 A | 11/1998 | Xie |
| 5,872,481 A | 2/1999 | Sevic et al. |
| 6,141,541 A | 10/2000 | Midya et al. |
| 6,256,482 B1 | 7/2001 | Raab |
| 6,285,767 B1 | 9/2001 | Klayman |
| 6,591,091 B1 | 7/2003 | Vorenkamp |
| 7,043,213 B2 | 5/2006 | Robinson et al. |
| 7,551,688 B2 | 6/2009 | Matero |
| 7,647,030 B2 | 1/2010 | Sorrells |
| 7,782,141 B2 | 8/2010 | Witmer et al. |
| 8,212,619 B2 | 7/2012 | Han |
| 8,400,221 B2 | 3/2013 | Adams |
| 8,860,510 B2 | 10/2014 | Wimpenny |
| 9,768,800 B1 | 9/2017 | Nguyen |
| 2003/0155978 A1* | 8/2003 | Pehlke ............ H03F 1/025 330/296 |
| 2007/0152750 A1 | 7/2007 | Andersen et al. |
| 2008/0318518 A1 | 12/2008 | Coutinho et al. |
| 2011/0058601 A1 | 3/2011 | Kim et al. |
| 2012/0133411 A1 | 5/2012 | Miao |
| 2012/0200354 A1 | 8/2012 | Ripley et al. |
| 2015/0249466 A1* | 9/2015 | Elyada ............ H03M 1/70 341/144 |
| 2018/0351523 A1* | 12/2018 | Lesso ............ H03F 3/187 |

OTHER PUBLICATIONS

Jianlong Chen, "A 62mW Stereo Class-G Headphone Driver with 108dB Dynamic Range and 600μA/Channel Quiescent Current", 2013 IEEE International Solid-State Circuits Conference, Feb. 19, 2013.

Frank N. L. Op't Eynde, "A CMOS Large-Swing Low-Distortion Three-Stage Class AB-Power Amplifier", IEEE Journal of Solid-State Circuits, vol. 25, No. 1, Feb. 1990.

* cited by examiner

AMPLIFIER CIRCUIT HAVING CONTROLLABLE OUTPUT STAGE

CROSS REFERENCE TO RELATED APPLICATIONS

This application claims the priority of U.S. Provisional Application No. 62/590,413, filed on Nov. 24, 2017, which is included herein by reference in its entirety.

BACKGROUND

In a Class-AB output stage, a crossover distortion is proportional to a ratio between an output current and a quiescent current. Therefore, there is a trade-off between the crossover distortion and the quiescent current. Specifically, in order to always lower the crossover distortion not matter if the output current is large or small, the quiescent current may be designed larger to improve the performance, but the larger quiescent current means large power consumption.

To solve this problem, one solution is using two different output stages in the amplifier circuit. For example, when an input signal has a lower strength (i.e. lower output current of the amplifier circuit), the amplifier circuit may select one of the output stages to generate an output signal, and when it is detected that the input signal becomes large (i.e. larger output current of the amplifier circuit), the amplifier circuit may select the other output stage to generate the output signal. However, designing two output stages may need more chip areas, and the switching operation between the two output stages may cause a glitch of the output signal.

SUMMARY

It is therefore an objective of the present invention to provide an amplifier circuit, which can adjust a quiescent current of an output stage at a zero-crossing point of the output signal according to contents of the input signal, to solve the above-mentioned problems.

According to one embodiment of the present invention, an amplifier circuit including a DAC, an output stage and a detector is provided. In the operations of the amplifier circuit, the DAC is arranged for performing a digital-to-analog converting operation upon a digital input signal to generate an analog signal, the output stage is arranged for receiving the analog signal to generate an output signal, and the detector is arranged for detecting a characteristic of the input signal, and referring to the characteristic of the input signal to generate at least one control signal to adjust the output stage at a zero-crossing point of the output signal.

According to another embodiment of the present invention, an amplifier circuit comprising a delay circuit, an output stage and a detector is provided. In the operations of the amplifier circuit, the delay circuit is arranged for delaying an input signal to generate a delayed input signal, the output stage is arranged for receiving the delayed input signal to generate an output signal, and the detector is arranged for detecting a characteristic of the input signal, and referring to the characteristic of the input signal to generate at least one control signal to adjust the output stage at a zero-crossing point of the output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
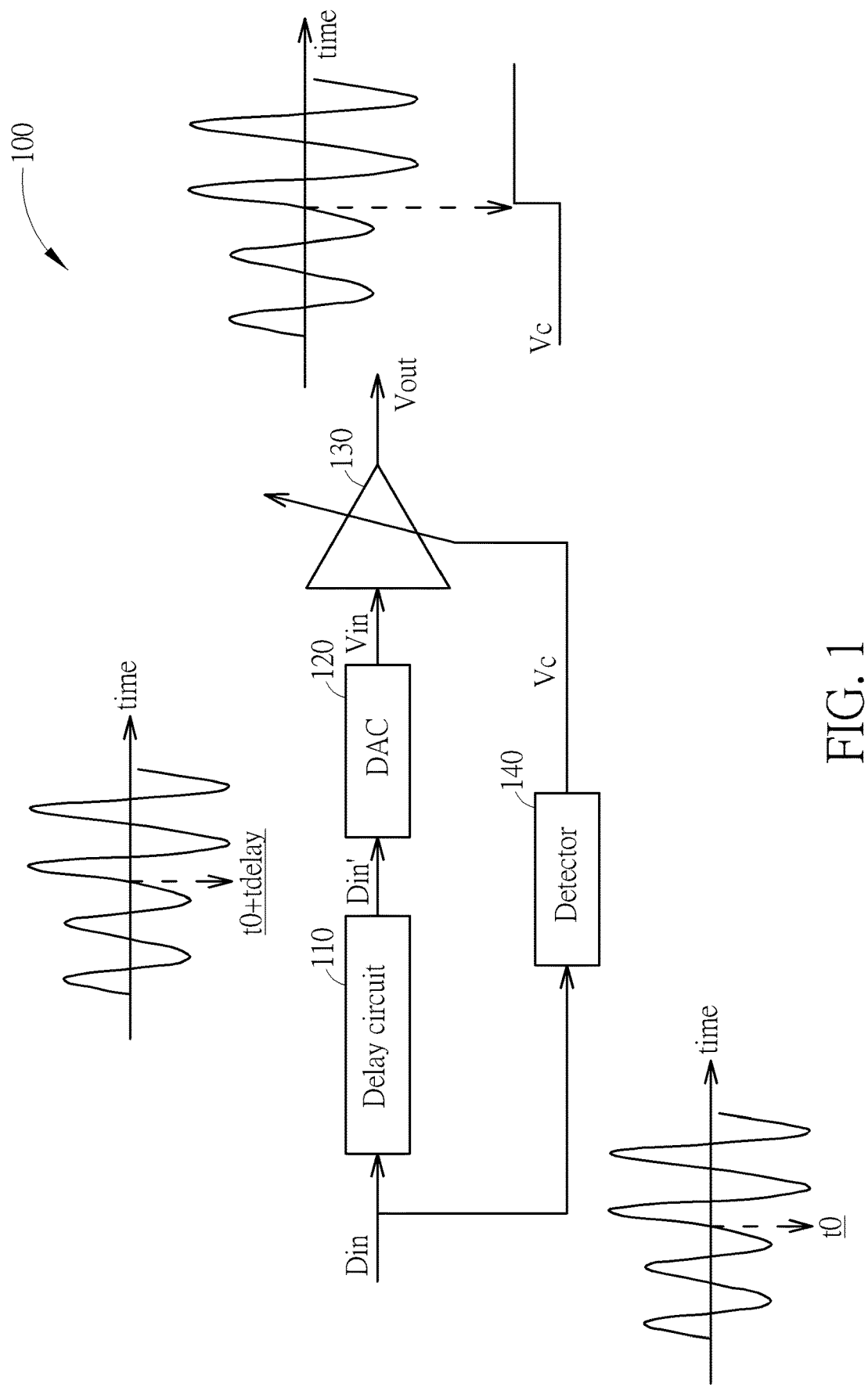
FIG. 1 shows an amplifier circuit according to one embodiment of the present invention.

FIG. 1 shows an amplifier circuit 100 according to one embodiment of the present invention. As shown in FIG. 1, the amplifier circuit 100 comprises a delay circuit 110, a digital-to-analog converter 120, an output stage 130 and a detector 140. In this embodiment, the amplifier circuit 100 is used to drive a speaker, the output stage 130 may be a Class-AB or Class-D output stage, and the amplifier circuit 100 is arranged to receive a digital input signal (audio signal) Din to generate an output signal Vout.

In the operations of the amplifier circuit 100, the delay circuit 110 receives the digital input signal Din to generate a delayed digital input signal Din', wherein the delay circuit has a delay amount "tdelay" as shown in FIG. 1. The DAC 120 performs a digital-to-analog converting operation upon the delayed digital input signal Din' to generate an analog signal Vin. Then, the output stage receives the analog signal Vin to generate an output signal Vout. Meanwhile, the detector 140 detects the contents of the digital input signal Din to generate a control signal Vc to control a quiescent current of the output stage 130. In detail, the detector 140 may analyze the contents of the digital input signal Din to determine a characteristic of the digital input signal Din. In this embodiment, the characteristic is the strength of the digital input signal Din in the following descriptions, where the strength of the digital input signal Din (audio signal) may indicate a volume of the audio signal and/or an output current of the output stage 130. In this embodiment, if the strength of the digital input signal Din becomes larger or smaller, then the detector 140 refers to the strength of the digital input signal Din to generate the control signal Vc to control the quiescent current of the output stage 130.

In this embodiment, in order to prevent glitches on the output signal Vout, the detector 140 generates the control signal Vc to adjust the quiescent current of the output stage 130 at a zero-crossing point of the output signal. Specifically, because of the delay circuit 110 is located in front of the DAC 120 and the output stage 130, the detector 140 can acquire the contents of the digital input signal Din in advance. Therefore, the detector 140 can preset the output stage 130 before a period of time "tdelay", and precisely send the control signal Vc to adjust the quiescent current of the output stage 130 at the zero-crossing point of the output signal Vout. For example, if the detector 140 detects that the strength of the digital input signal Din becomes large as shown in FIG. 1, the detector 140 may wait the period of time "tdelay", then sends the control signal Vc to increase the quiescent current of the output stage 130 at the zero-crossing point of the output signal Vout. Due to increasing the quiescent current of the output stage 130 at the zero-crossing point, the crossover distortion can be reduced without generating any glitch at the output signal Vout. In the other case, if the detector 140 detects that the strength of the digital input signal Din becomes smaller, the detector 140 may wait the period of time "tdelay", then sends the control signal Vc to decrease the quiescent current of the output stage 130 at the zero-crossing point of the output signal Vout. Because of decreasing the quiescent current of the output stage 130 at the zero-crossing point, the power consumption can be lowered, where the crossover distortion may not be an issue since the output signal Vout is small.

Figure 2:
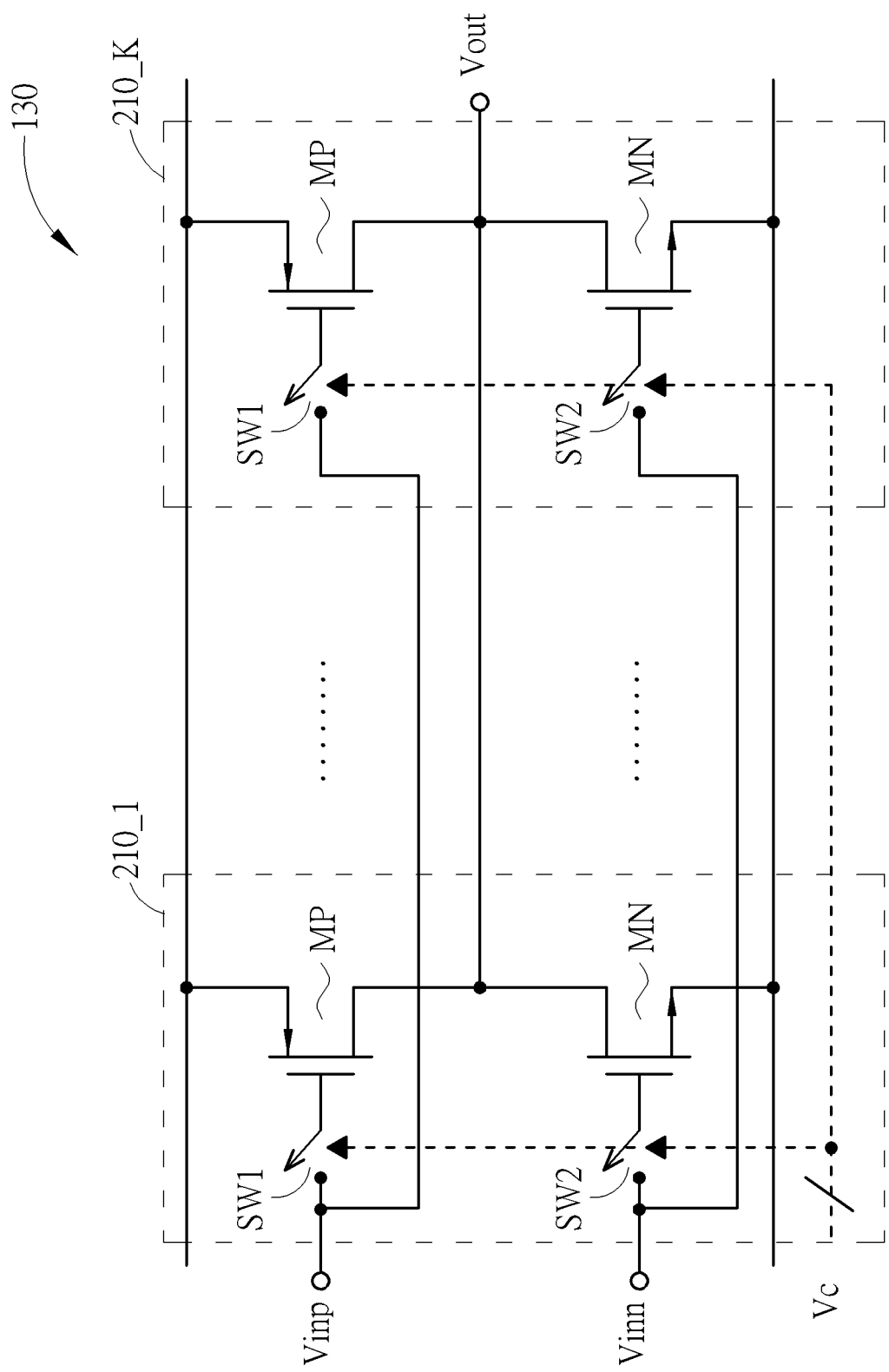
FIG. 2 is a diagram illustrating the output stage according to a first embodiment of the present invention.

The quiescent current of the output stage 130 can be controlled by adjusting the size or the bias current of the output stage. FIG. 2 is a diagram illustrating the output stage 130 according to a first embodiment of the present invention. As shown in FIG. 2, the output stage 130 comprises a plurality of segments 210_1-210_K, wherein each of the segments 210_1-210_K comprises a P-type transistor MP, an N-type transistor MN and two switches SW1 and SW2. In this embodiment, the analog signal Vin has a first signal Vinp and a second signal Vinn, and the P-type transistors MP and the N-type transistors MN of the segments 210_1-210_K receive the first signal Vinp and the second signal Vinn, respectively, to generate the output signal Vout. In addition, each of the segments 210_1-210_K may be enabled or disabled according to the strength of the digital input signal Din and/or the strength of the output signal Vout. In detail, if the detector 140 detects that the strength of the digital input signal Din becomes larger as shown in FIG. 1, the detector 140 may generate the control signals Vc to enable more segments 210_1-210_K, for example, the control signals Vc may close the switches SW1 and SW2 of all of the segments 210_1-210_K. Because all of the segments 210_1-210_K are enabled, it means that each segment 210_1-210_K provides quiescent current to make the overall quiescent current of the output stage 130 larger. In the other case, if the detector 140 detects that the strength of the digital input signal Din becomes smaller, the detector 140 may generate the control signals Vc to disable some of the segments 210_1-210_K, for example, the control signals Vc may only close the switches SW1 and SW2 of the segment 210_1, and the switches SW1 and SW2 of the other segment 210_2-210_K are opened. Because only the segment 210_1 is enabled, it means that the quiescent current of output stage 130 is only consumed by the segment 210_1, that is the output stage 130 has a smaller quiescent current.

In one embodiment shown in FIG. 2, the control signal Vc may be a discrete-time signal or a digital signal, and the bias current of each segment may be fixed (i.e. the bias voltages (DC voltages) of the P-type transistors MP and the N-type transistors MN are fixed).

It is noted that the circuits shown in FIG. 2 is for illustrative purposes only.

As long as the size of the output stage 130 may be adjusted according to the control signals Vc, the output stage 130 may be other circuit designs.

Figure 3:
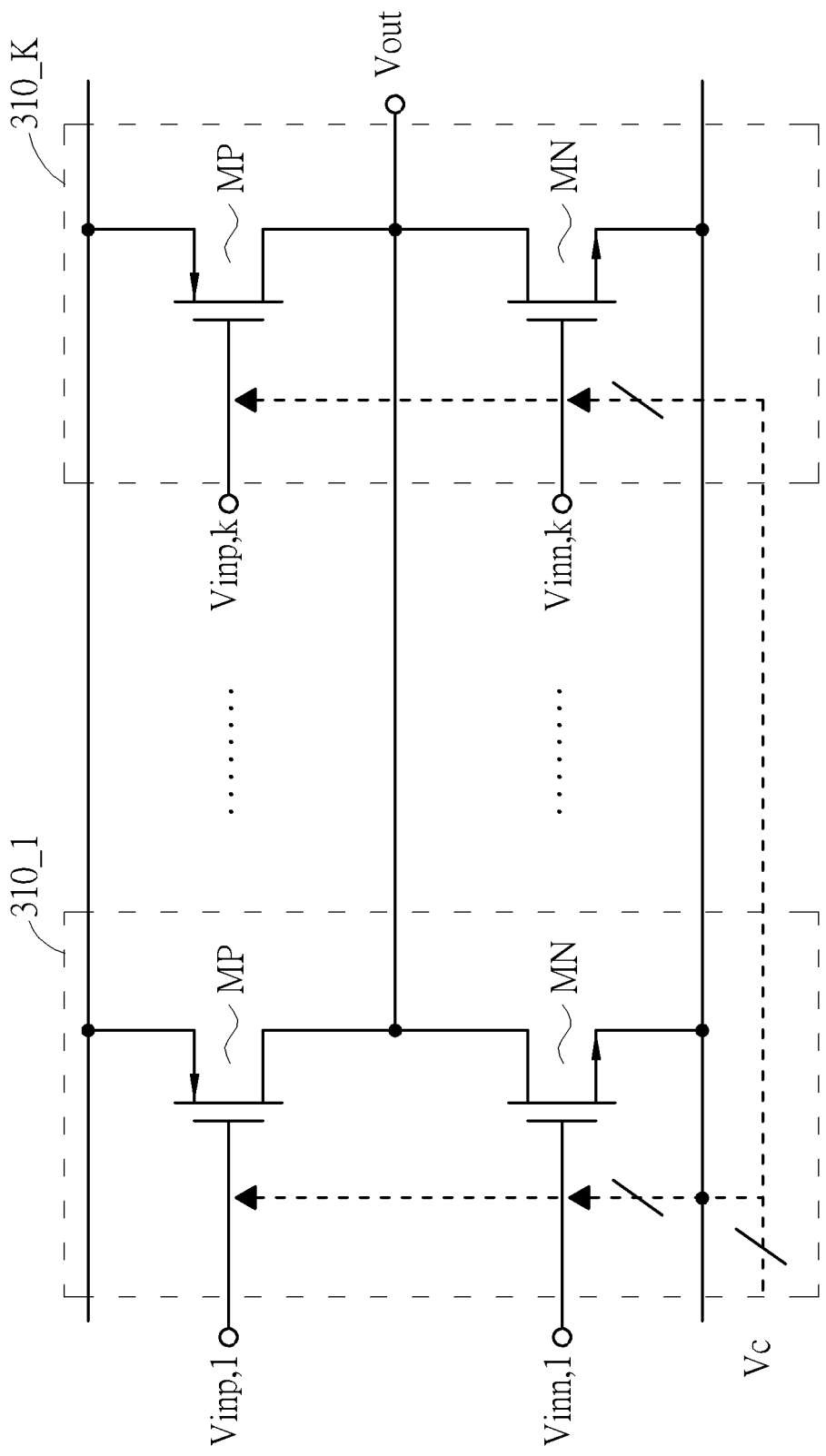
FIG. 3 is a diagram illustrating the output stage according to a second embodiment of the present invention.

FIG. 3 is a diagram illustrating the output stage 130 according to a second embodiment of the present invention. As shown in FIG. 3, the output stage 130 comprises a plurality of segments 310_1-310_K, wherein each of the segments 310_1-310_K comprises a P-type transistor MP and an N-type transistor MN, and K can be any suitable positive integer. In this embodiment, the analog signal Vin comprises first-group signals Vinp,1-Vinp,k and second-group signal Vinn,1-Vinn,k, and the P-type transistors MP and the N-type transistors MN of the segments 310_1-310_K receive the first-group signals Vinp,1-Vinp,k and the second-group signals Vinn,1-Vinn,k, respectively, to generate the output signal Vout. In addition, the control signals Vc generated by the detector 140 may be used to adjust a bias voltage (DC voltage) of the P-type transistors MP and the N-type transistors MN to adjust bias currents of the segments 310_1-310_K. In detail, if the detector 140 detects that the strength of the digital input signal Din becomes larger as shown in FIG. 1, the detector 140 may generate the control signals Vc to lower the bias voltage of the P-type transistors MP and increase the bias voltage of the N-type transistors MN to increase the bias current of at least a portion of the segments 310_1-310_K. Because increasing the bias current means increasing the quiescent current, the overall quiescent current of the output stage 130 may be increased because at least a portion of the segments 310_1-310_K are controlled to provide larger bias current/quiescent current. In the other case, if the detector 140 detects that the strength of the digital input signal Din becomes smaller, the detector 140 may generate the control signals Vc to increase the bias voltage of the P-type transistors MP and decrease the bias voltage of the N-type transistors MN to decrease the bias current of at least a portion of the segments 310_1-310_K. Because decreasing the bias current means decreasing the quiescent current, the overall quiescent current of the output stage 130 may be decreased because at least a portion of the segments 310_1-310_K are controlled to provide less bias current/quiescent current.

It is noted that the circuits shown in FIG. 3 is for illustrative purposes only. As long as the size of the output stage 130 may be adjusted according to the control signals Vc, the output stage 130 may be implemented by other circuit designs, for example, the output stage 130 may have only one segment. These alternative designs shall fall within the scope of the present invention.

In one embodiment shown in FIG. 3, the control signal Vc may be a continuous-time signal or an analog signal, and a size of the output stage 130 is fixed (i.e. the segments 310_1-310_K are always enabled).

It is noted that the delay circuit 110 shown in FIG. 1 may be an optional device, that is the delay circuit 110 can be removed from the amplifier circuit 100 without influencing the proper function. Specifically, because DAC 120 also has a delay, the delay amount "tdelay" shown in FIG. 1 may be provided by the DAC 120 without using the additional delay circuit 110. As long as the delay of the DAC 120 can be known and the delay of the DAC 120 is enough for the detector 140 analyzing the digital input signal Din and generating the control signal Vc, the delay circuit 110 may be removed to save the manufacturing cost.

Figure 4:
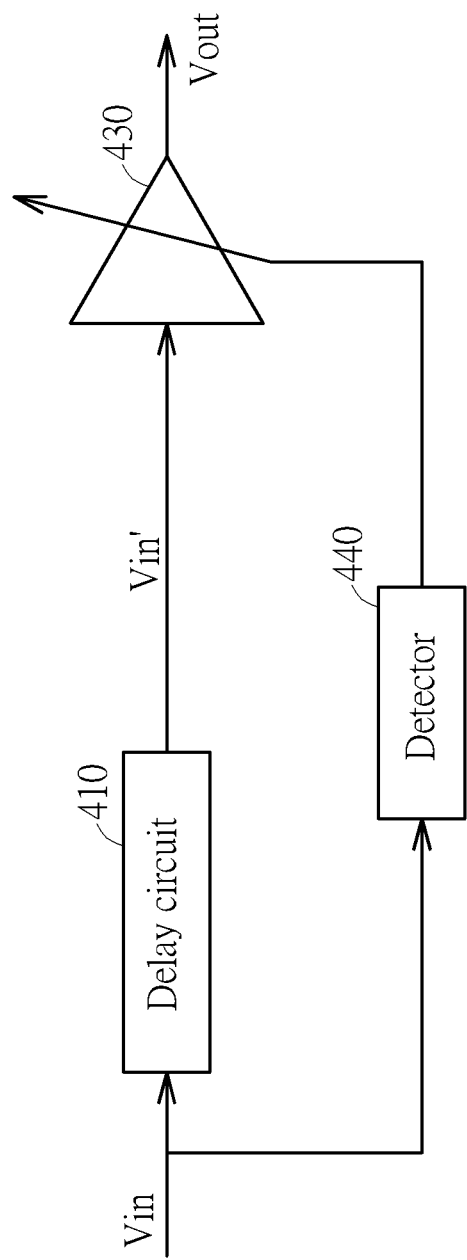
FIG. 4 shows an amplifier circuit according to another embodiment of the present invention.

FIG. 4 shows an amplifier circuit 400 according to another embodiment of the present invention. As shown in FIG. 4, the amplifier circuit 400 comprises a delay circuit 410, an output stage 430 and a detector 440. In this embodiment, the amplifier circuit 400 is used to drive a speaker, the output stage 430 may be a class-AB or class-D output stage, and the amplifier circuit 400 is arranged to receive an input signal (analog signal) to generate an output signal Vout.

In the operations of the amplifier circuit 400, the delay circuit 410 receives the input signal Vin to generate a delayed input signal Vin', and the output stage 430 receives the delayed input signal Vin' to generate the output signal Vout. Meanwhile, the detector 440 detects the contents of the input signal Vin to generate a control signal Vc to adjust a quiescent current of the output stage 430. In detail, the detector 440 may analyze the contents of the input signal Vin to determine a characteristic of the input signal Vin. In this embodiment, the characteristic is the strength of the input signal Vin in the following descriptions, where the strength of the input signal Vin (audio signal) may indicate a volume of the audio signal and/or an output current of the output stage 430. In this embodiment, if the strength of the input signal Vin becomes larger or smaller, then the detector 440 refers to the strength of the digital input signal Din to generate the control signal Vc to adjust the quiescent current of the output stage 430.

In this embodiment, in order to prevent the glitch on the output signal Vout, the detector 440 generates the control signal Vc to adjust the quiescent current of the output stage 430 at a zero-crossing point of the output signal Vout. Specifically, because of the delay circuit 410 located in front of the output stage 430, the detector 440 can acquire the contents of the input signal Vin in advance. Therefore, the detector 440 can preset the output stage 430, and wait a period of time to precisely send the control signal Vc to adjust the quiescent current of the output stage 430 at the zero-crossing point of the output signal Vout. For example, if the detector 440 detects that the strength of the input signal Vin becomes larger, the detector 440 may wait the period of time then sends the control signal Vc to increase the quiescent current of the output stage 430 at the zero-crossing point of the output signal Vout. Due to increasing the quiescent current of the output stage 430 at the zero-crossing point, the crossover distortion can be improved without generating any glitch at the output signal Vout. In the other case, if the detector 440 detects that the strength of the digital input signal Din becomes smaller, the detector 440 may wait the period of time then sends the control signal Vc to decrease the quiescent current of the output stage 430 at the zero-crossing point of the output signal Vout. Because of decreasing the quiescent current of the output stage 430 at the zero-crossing point, the power consumption can be lowered.

The output stage 430 may be implemented by the embodiment shown in FIG. 2 or FIG. 3.

Briefly summarized, in the amplifier circuit of the present invention, the quiescent current of the output stage is adjusted at a zero-crossing point of the output signal according to the strength of the input/output signal. Therefore, the amplifier circuit may not suffer the crossover distortion while driving a large output current, and can save much power consumption while driving a small or zero output current. Furthermore, because the output stage is adjusted at the zero-crossing point of the output signal, the glitch of the output signal can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
    a digital-to-analog converter (DAC), for performing a digital-to-analog converting operation upon a digital input signal to generate an analog signal;
    an output stage, coupled to the DAC, for receiving the analog signal to generate an output signal; and
    a detector, coupled to the output stage, for detecting a characteristic of the input signal, and referring to the characteristic of the input signal to generate at least one control signal to adjust a quiescent current of the output stage at a zero-crossing point of the output signal.

2. The amplifier circuit of claim 1, further comprising:
    a delay circuit, for delaying the digital input signal to generate a delayed digital input signal;
    wherein the DAC performs the digital-to-analog converting operation upon the delayed digital input signal to generate the analog signal.

3. The amplifier circuit of claim 1, wherein the detector refers to the strength of the input signal to generate the at least one control signal to adjust a size of the output stage at the zero-crossing point of the output signal.

4. The amplifier circuit of claim 3, wherein the output stage comprises:
    a plurality of segments, wherein each of the segments selectively receives the analog signal via at least one switch;
    wherein the detector generates a plurality of control signals to control the switches of the segments, respectively.

5. The amplifier circuit of claim 4, wherein the analog signal comprises a first signal and a second signal, and each of the segments comprises:
    a P-type transistor, for selectively receives the first signal via a first switch; and
    an N-type transistor, coupled to the P-type transistor via a node, for selectively receives the second signal via a second switch;
    wherein the nodes of the segments are connected together and generate the output signal.

6. The amplifier circuit of claim 3, wherein a bias current of the output stage is fixed.

7. The amplifier circuit of claim 1, wherein the detector refers to the characteristic of the input signal to generate the at least one control signal to adjust a bias current of the output stage at the zero-crossing point of the output signal.

8. The amplifier circuit of claim 7, wherein the analog signal comprises a first signal and a second signal, and the output stage comprises:
    a P-type transistor, for receiving the first signal; and
    an N-type transistor, coupled to the P-type transistor, for receiving the second signal;
    wherein the detector generates the at least one control signal to adjust bias voltages of the P-type transistor and the N-type transistor.

9. The amplifier circuit of claim 7, wherein the analog signal comprises a first signal and a second signal, and the output stage comprises:
    a plurality of segments, wherein each of the segments comprises:
    a P-type transistor, for receiving the first signal; and
    an N-type transistor, coupled to the P-type transistor via a node, for receiving the second signal, wherein the nodes of the segments are connected together and generate the output signal;
    wherein the detector generates a plurality of control signals to adjust bias voltages of the P-type transistor and the N-type transistor of the segments, respectively.

10. The amplifier circuit of claim 7, wherein a size of the output stage is fixed.

11. The amplifier circuit of claim 1, wherein the input signal is an audio signal, and the characteristic of the input signal is a strength of the input signal or a volume of the input signal.

12. The amplifier circuit of claim 1, wherein the output stage is a Class-AB output stage.

13. The amplifier circuit of claim 1, wherein the output stage is a Class-D output stage.

14. An amplifier circuit, comprising:
    a delay circuit, for delaying an input signal to generate a delayed input signal;
    an output stage, coupled to the delay circuit, for receiving the delayed input signal to generate an output signal; and a detector, coupled to the output stage, for detecting a characteristic of the input signal, and referring to the characteristic of the input signal to generate at least one control signal to adjust a quiescent current of the output stage at a zero-crossing point of the output signal.

15. The amplifier circuit of claim 14, wherein the detector refers to the characteristic of the input signal to generate the at least one control signal to adjust a size of the output stage at the zero-crossing point of the output signal.

16. The amplifier circuit of claim 15, wherein a bias current of the output stage is fixed.

17. The amplifier circuit of claim 14, wherein the detector refers to the characteristic of the input signal to generate the at least one control signal to adjust a bias current of the output stage at the zero-crossing point of the output signal.

18. The amplifier circuit of claim 17, wherein a size of the output stage is fixed.

19. The amplifier circuit of claim 14, wherein the input signal is an audio signal, and the characteristic of the input signal is a strength of the input signal or a volume of the input signal.

20. The amplifier circuit of claim 14, wherein the output stage is a Class-AB output stage or a Class-D output stage.

* * * * *